(12) United States Patent
Oshida et al.

(10) Patent No.: US 7,755,741 B2
(45) Date of Patent: Jul. 13, 2010

(54) SUBSTRATE EXPOSURE APPARATUS AND ILLUMINATION APPARATUS

(75) Inventors: Yoshitada Oshida, Ebina (JP); Kazuo Kobayashi, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 254 days.

(21) Appl. No.: 11/839,863

(22) Filed: Aug. 16, 2007

(65) Prior Publication Data
US 2008/0079921 A1   Apr. 3, 2008

(30) Foreign Application Priority Data
Sep. 30, 2006   (JP)   ............... 2006-270173

(51) Int. Cl.
G03B 27/54   (2006.01)
G03B 27/52   (2006.01)
G03B 27/72   (2006.01)

(52) U.S. Cl. ............... 355/67; 355/55; 355/71

(58) Field of Classification Search ............ 355/53, 355/67–71; 335/52, 53, 55, 67–71; 250/492.1, 250/492.2, 492.22, 548
See application file for complete search history.

(56) References Cited

U.S. PATENT DOCUMENTS

| | | | | |
|---|---|---|---|---|
| 4,682,885 A | * | 7/1987 | Torigoe | ............... 355/67 |
| 5,296,892 A | * | 3/1994 | Mori | ............... 355/67 |
| 5,991,088 A | * | 11/1999 | Mizouchi | ............... 359/649 |
| 6,133,986 A | * | 10/2000 | Johnson | ............... 355/67 |
| 6,563,567 B1 | * | 5/2003 | Komatsuda et al. | ............... 355/71 |
| 6,583,937 B1 | * | 6/2003 | Wangler et al. | ............... 359/624 |
| 6,876,494 B2 | * | 4/2005 | Ishikawa et al. | ............... 359/618 |
| 2005/0281516 A1 | * | 12/2005 | Okazaki et al. | ............... 385/96 |
| 2006/0023192 A1 | * | 2/2006 | Gui | ............... 355/67 |
| 2006/0050403 A1 | * | 3/2006 | Neil | ............... 359/668 |
| 2008/0118867 A1 | * | 5/2008 | Sato et al. | ............... 430/286.1 |

FOREIGN PATENT DOCUMENTS

JP   2004-39871 A   2/2004
WO   01/61411 A1   8/2001

* cited by examiner

Primary Examiner—Peter B Kim
Assistant Examiner—Christina Riddle
(74) Attorney, Agent, or Firm—Crowell & Moring, LLP

(57) ABSTRACT

An illumination apparatus and an exposure apparatus that achieves higher quality exposure to light and higher operating speed even where the ratio Hx/Hy between the transverse dimension Hx and the longitudinal dimension Hy of the plane of optical modulation of a two-dimensional optical space modulator is 1.5 or above, for instance, are to be provided. The focal distance fx in an x-direction and the focal distance fy in a y-direction of a second optical system that guides light emitted from an integrator to a two-dimensional optical space modulator are made different, in a ratio of fx/fy=1.6, for instance. In this way, the number of rod lenses in the integrator can be made equal between transverse and longitudinal directions and the value of Hx/Hy can be made 2.5 by bringing the aspect ratio dx:dy of rod lenses to 1.6:1, close to 1.

1 Claim, 7 Drawing Sheets

SUBSTRATE EXPOSURE APPARATUS AND ILLUMINATION APPARATUS

BACKGROUND OF THE INVENTION

The present invention relates to a substrate exposure apparatus and an illumination apparatus.

The previous procedure to pattern a printed circuit board, the TFT substrate or color filter substrate of a liquid crystal display or the substrate of a plasma display by exposure to light was to fabricate a mask, which constitutes the master of the pattern, and to expose the substrate to light with mask exposure apparatus using this master mask. However, fabricating a mask for each substrate posed problems, such as taking a long time to obtain the intended product. As a solution to these problems, what is known as the Direct Exposure Machine (DE) which can directly draw a desired pattern (by exposure to light) by use of a two-dimensional optical space modulator capable of two-dimensional modulation of light, such as a liquid crystal display or a digital mirror device (DMD), is now in proliferation (see Patent Document 1). The working process of the exposure apparatus disclosed in Patent Document 1 begins by shaping light emitted from plural light sources into beams which are circular in sectional shape, and then bringing them into incidence on an integrator including plural rod lenses, and exposing a substrate to light for patterning by being moved in one direction while a DMD which is a two-dimensional optical space modulator is irradiated with light emerging from the integrator while modulation is being accomplished with the DMD.

Patent Document 1: JP-A-039871/2004

SUMMARY OF THE INVENTION

FIG. 11 shows a plan of a two-dimensional optical space modulator.

In a DMD, square display picture elements (micro-mirrors; hereinafter referred to as simply "mirrors") are arranged in array of Nx columns in the transverse direction (the x-direction) and Ny rows in the longitudinal direction (the y-direction), respectively. Usually the ratio between Nx and Ny is about 4:3.

The previous practice was to irradiate the whole plane of optical modulation (the area of Nx×Ny, if the gaps between adjoining mirrors are ignored and the length of the mirror is taken as the unit; hereinafter the plane of optical modulation will also be referred to as DMD) with light, and to turn on and off the mirrors according to the pattern to be drawn.

In recent years, it was discovered that, where the optical energy supplied being the same, the exposure speed could be made faster by making an irradiated area a rectangle (Hx×Hy) whose shorter sides are in the moving direction of the substrate and increasing the value of Hx/Hy than by irradiating the whole DMD area whose Nx/Ny ratio is 4:3 on account of the characteristics of the DMD. Thus, even in the DMD in which Nx×Ny mirrors are arranged, the exposure speed can be made faster by moving only the mirrors in the Hx×Hy area in the illustration. In the following description, since Hx=Nx where a DMD of Nx×Ny is used, the number of mirrors in the x direction will be referred to as Hx instead of Nx. To add, in order to uniformize the intensity of light to irradiate the DMD, it is preferable to arranged at least five (more preferably seven) rod lenses on each side of the integrator.

Where the Hx×Hy area is to be irradiated, by so bundling rod lenses in advance as to make the aspect ratio of the rod lenses Hx/Hy, similarly to the irradiated area, and to make the section of the integrator to the irradiated area (namely the same numbers in the xy-directions), shaping substantially in a circle the light to be brought incident on this integrator and condensing the light emerged from the rod lenses with a rotationally symmetric condenser lens, the Hx×Hy area can be irradiated uniformly, but a large number of rod lenses are required in this way.

Moreover, as the angle of divergence widely differs in the light irradiating the Hx×Hy area, the line width differs between lines in the x-direction and lines in the y-direction, making it impossible to achieve higher quality exposure to light. Conventionally, this problem could be solved by shaping in a substantial oval the light brought to incidence on the integrator and thereby substantially equalizing the angles of divergence, but this was about the limit of adjustable range.

An object of the present invention is to provide an illumination apparatus and an exposure apparatus permitting higher quality exposure to light and higher operating speed even where the ratio Hx/Hy between the transverse dimension Hx and the longitudinal dimension Hy (wherein the longitudinal direction is the moving direction of the substrate to be exposed to light) of the plane of optical modulation of a two-dimensional optical space modulator is 1.5 or above, for instance.

In order to solve the problems noted above, the invention in its first aspect provides a substrate exposure apparatus including an exposure light source; a beam forming device that forms light emitted from the exposure light source into highly directional light beams; a first optical system that guides the directional beams to an integrator; the integrator; a second optical system that irradiates a two-dimensional optical space modulator with light emerging from the integrator; the two-dimensional optical space modulator; a projection optical system that projects the light reflected or transmitted by the two-dimensional optical space modulator onto and expose to light an exposure substrate; and a stage that is mounted with and scans the exposure substrate in at least one direction, wherein the second optical system is an optical system having different focal distances in two directions of x and y which are orthogonal to the optical axis.

In order to solve the problems noted above, the invention in its second aspect provides an illumination apparatus including a light source; a beam forming device that forms light emitted from the light source into highly directional light beams; a first optical system that guides the highly directional beams to an integrator; the integrator; and a second optical system that irradiates an object of irradiation with light emerging from the integrator, wherein the second optical system is an optical system having different focal distances in the two directions of x and y which are orthogonal to the optical axis.

According to the invention, higher quality exposure to light and higher operating speed can be achieved even where the ratio Hx/Hy between the transverse dimension Hx and the longitudinal dimension Hy (wherein the longitudinal direction is the moving direction of the substrate to be exposed to light) of the plane of optical modulation of a two-dimensional optical space modulator is 1.5 or above, for instance.

DETAILED DESCRIPTION OF THE PREFERRED EMBODIMENTS

Figure 1:
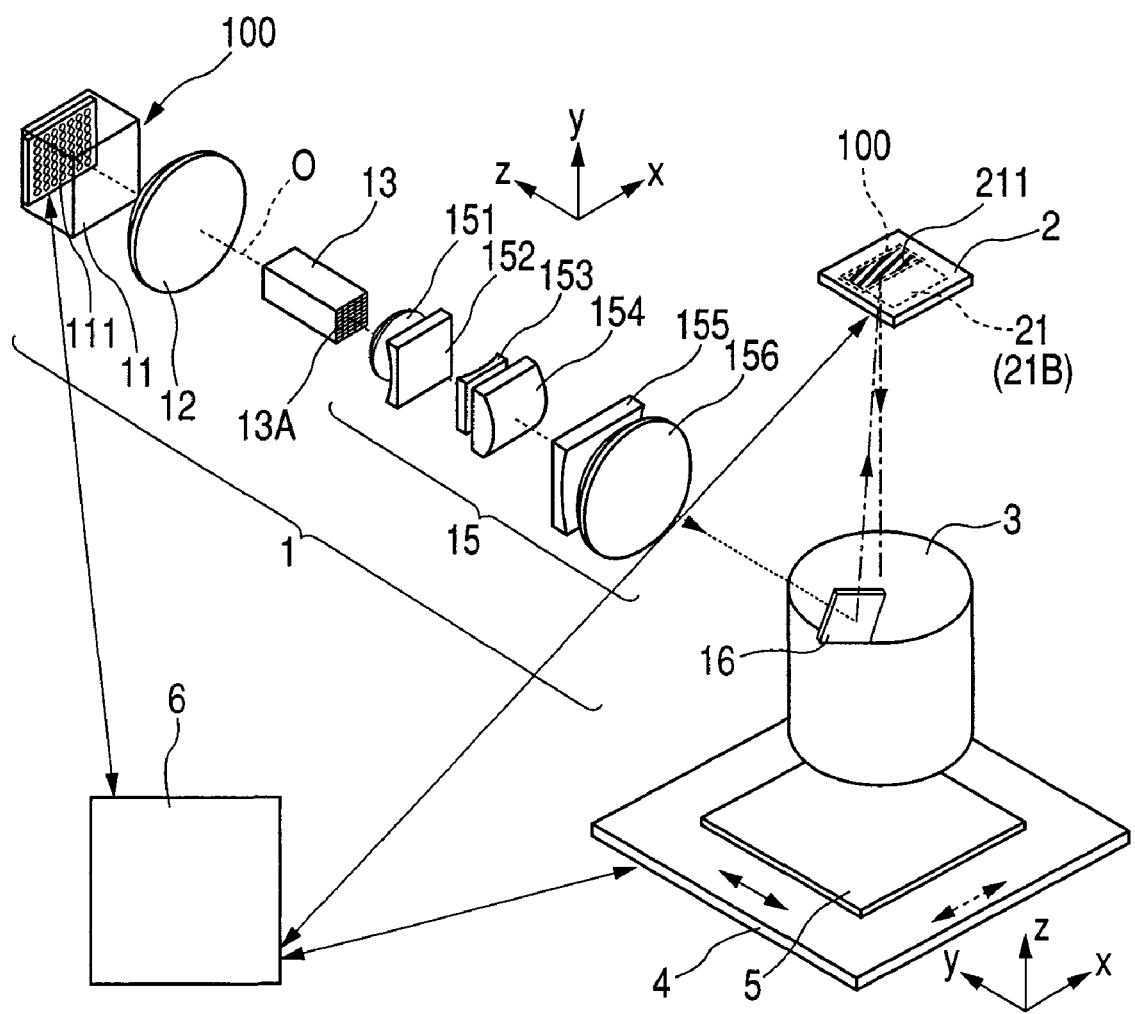
FIG. 1 shows the configuration of an exposure apparatus according to the invention.

FIG. 1 shows the configuration of an exposure apparatus according to the invention.

First, the overall configuration will be described.

N laser beams whose main beams are parallel to the center axis O are output from a light source unit 100. When the light source unit 100 being supposed to be a single light source here, the center axis of the light output from the light source unit 100 is referred to as the center axis O. On the center axis O, there are arranged an optical system 12, an integrator 13, a second optical system 15, a mirror 16, a two-dimensional optical space modulator 2 and a projection system 3. An exposure substrate 5 mounted on a stage 4 is arranged on the emission side of the projection system 3.

Next, each individual element will be described in due sequence.

First, the light source unit 100 will be described.

Figure 2:
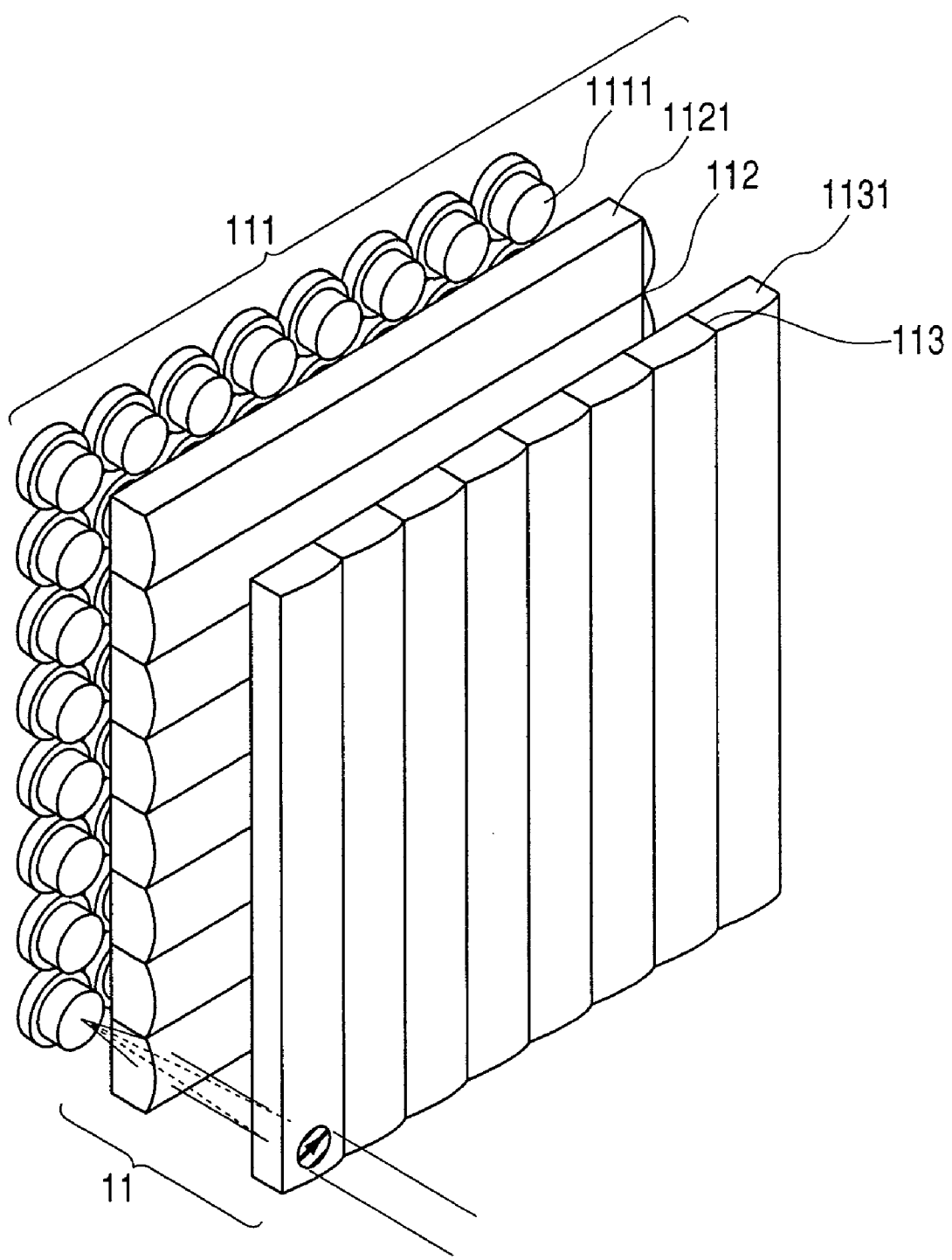
FIG. 2 shows a perspective view of a light source unit according to the invention.

FIG. 2 shows a perspective view of the light source unit 100. The light source unit 100 includes a semiconductor laser array 111 and a beam forming device 11. In the semiconductor laser array 111, plural semiconductor lasers (hereinafter abbreviated to LDs) 1111 of 407 nm (or 375 nm) in wavelength are arrayed in the xy-directions at equal pitches. The angles of divergence of the LD-emitted beams are 22° in the vertical direction and 8° in the horizontal direction in FIG. 2. The beam forming device 11 is formed of a cylindrical lens array 112 and a cylindrical lens array 113. The cylindrical lens array 112 includes cylindrical lenses 1121 arrayed in the vertical direction. The cylindrical lenses 1121, which are short in focal distance (7 mm), make beams of 22° in the angle of divergence substantially parallel to the vertical direction. The cylindrical lens array 113 includes cylindrical lenses 1131 arrayed in the horizontal direction. The cylindrical lenses 1131, which are long in focal distance (23 mm), make beams of 8° in the angle of divergence substantially parallel to the horizontal direction. The configuration described above make the principal rays of laser beams emitted from the large number of LDs 1111 substantially parallel to one another (i.e. highly directional).

The optical system 12, composed of a condenser lens for instance, directs the main ones of N laser beams outputted from the beam forming device 11 to the center of the plane of incidence of the integrator 13 and the beams emitted from the LDs to the external shape of the integrator 13 (for instance, forms them into a beam having a diameter circumscribing the integrator 13).

Next, the integrator 13 will be described.

Figure 3:
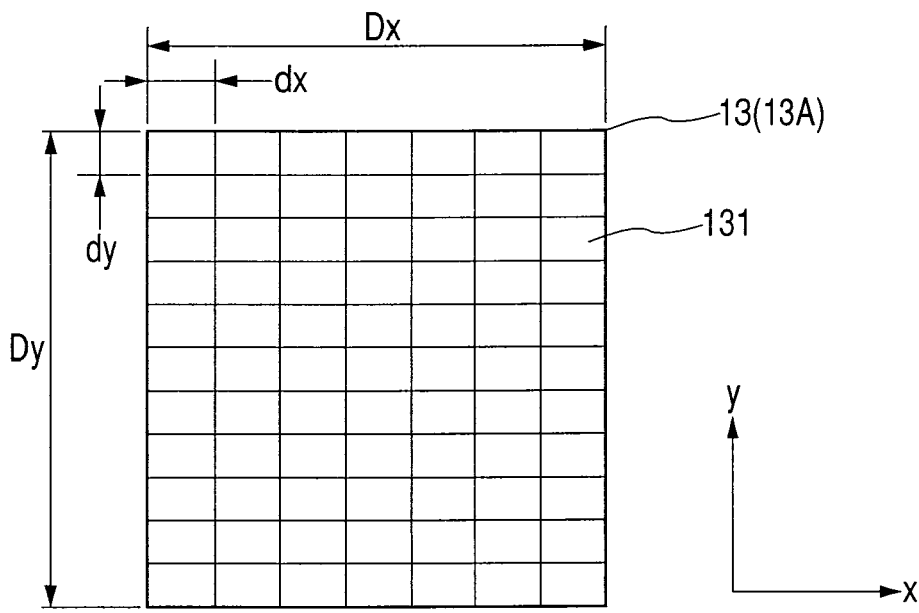
FIG. 3 shows a plan of the plane of incidence of an integrator.

FIG. 3 shows a plan of the plane of incidence of the integrator 13.

The integrator 13 includes J and K rod lenses 131 arrayed in the x-direction and in the y-direction, respectively. Each of the rod lenses 131 measures dx in the x-direction and dy in the y-direction. Therefore, the external dimensions Dx and Dy of the integrator in the xy-directions are Jdx and Kdy, respectively.

With the length and refractive index of each rod lens 131 being represented by L and n, respectively, the curvatures R of the rod lens 131 in the incidence and emergence sides are (n−1)L/n. The principal rays of the beams emitted from the plane of emergence 13A of the integrator 13 composed of such rod lenses 131, from whichever rod lens 131 they may come from, are also parallel to the center axis O. The angles of divergence θx and θy in the xy-directions of the beams emerging from the rod lenses 131 in the xy-directions are represented by Equations 1 and 2.

$$\theta x = n d x / 2 L \qquad \text{Equation 1}$$

$$\theta y = n d y / 2 L \qquad \text{Equation 2}$$

As indicated by Equations 1 and 2, the angles of divergence in the xy-directions of the beams emerging from the rod lenses 131 are proportional to the transverse and longitudinal lengths of the end planes of incidence and emergence of the rod lenses 131.

Next, the second optical system 15 will be described.

As shown in FIG. 1, the second optical system 15 includes spherical lenses 151 and 156 and cylindrical lenses 152 through 155. The spherical lens 151, the cylindrical lens 153 having power in the x-direction and the spherical lens 156 make the focal distance in the x-direction fx, while the spherical lens 151, the cylindrical lenses 152, 154 and 155 having power in the y-direction and the spherical lens 156 make the focal distance in the y-direction fy.

Figure 4A:
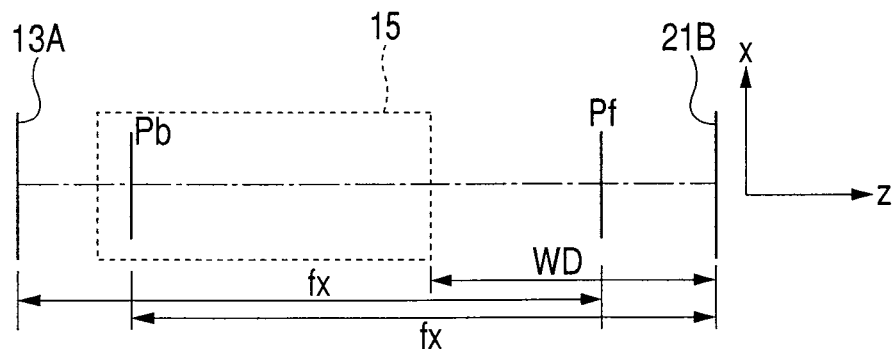
FIGS. 4A and 4B show the relationship between the front focus and the back focus of a second optical system according to the invention.
Figure 4B:
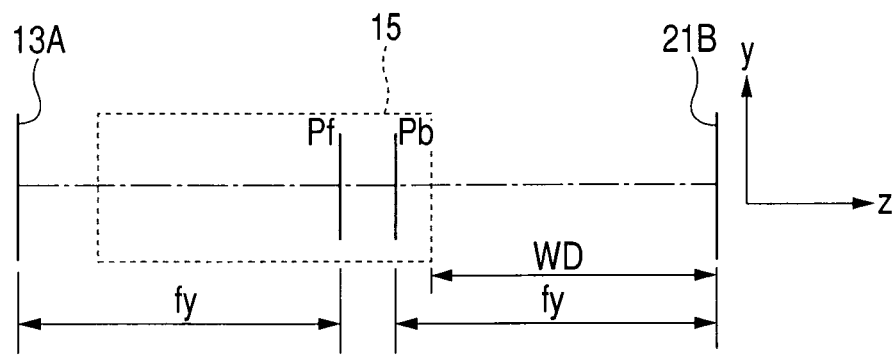

FIGS. 4A and 4B show the relationship between the front focus and the back focus of the second optical system 15 according to the invention wherein FIG. 4A shows the x-direction and FIG. 4B shows the y-direction.

As shown in FIG. 4A, the plane of emergence 13A of the integrator 13 is arranged at the front focus, and the plane of optical modulation 21B of the two-dimensional optical space modulator 2 at the back focus, in the x-direction. Further, as shown in FIG. 4B, the plane of emergence 13A of the integrator 13 is arranged at the front focus, and the plane of optical modulation 21B of the two-dimensional optical space modulator 21 is arranged at the back focus, in the y-direction. Pf in FIGS. 4A and 4B indicates the position of the front principal plane, and Pb indicates that of the back principal plane. WD represents the distance from the second optical system 15 to the two-dimensional optical space modulator 2. As shown therein, the focal distance fx is longer than the focal distance fy.

With the angles of divergence in the x-direction and in y-direction of beams emerging from the rod lenses 131 constituting the integrator 13 being represented by θx and θy, respectively, the widths Wx and Wy of the illuminating beams mainly irradiating the plane of optical modulation 21B of the two-dimensional optical space modulator 2 are given by Equations 3 and 4, respectively.

$$Wx = fx \cdot \theta x = fx \cdot n d x / 2 L \qquad \text{Equation 3}$$

$$Wy = fy \cdot \theta y = fy \cdot n d y / 2 L \qquad \text{Equation 4}$$

By bringing this illuminated area Wx×Wy as close as possible to the display area Hx×Hy of the two-dimensional optical space modulator, the efficiency of light utilization can be enhanced.

Next, the projection system 3 will be described.

Figure 5:
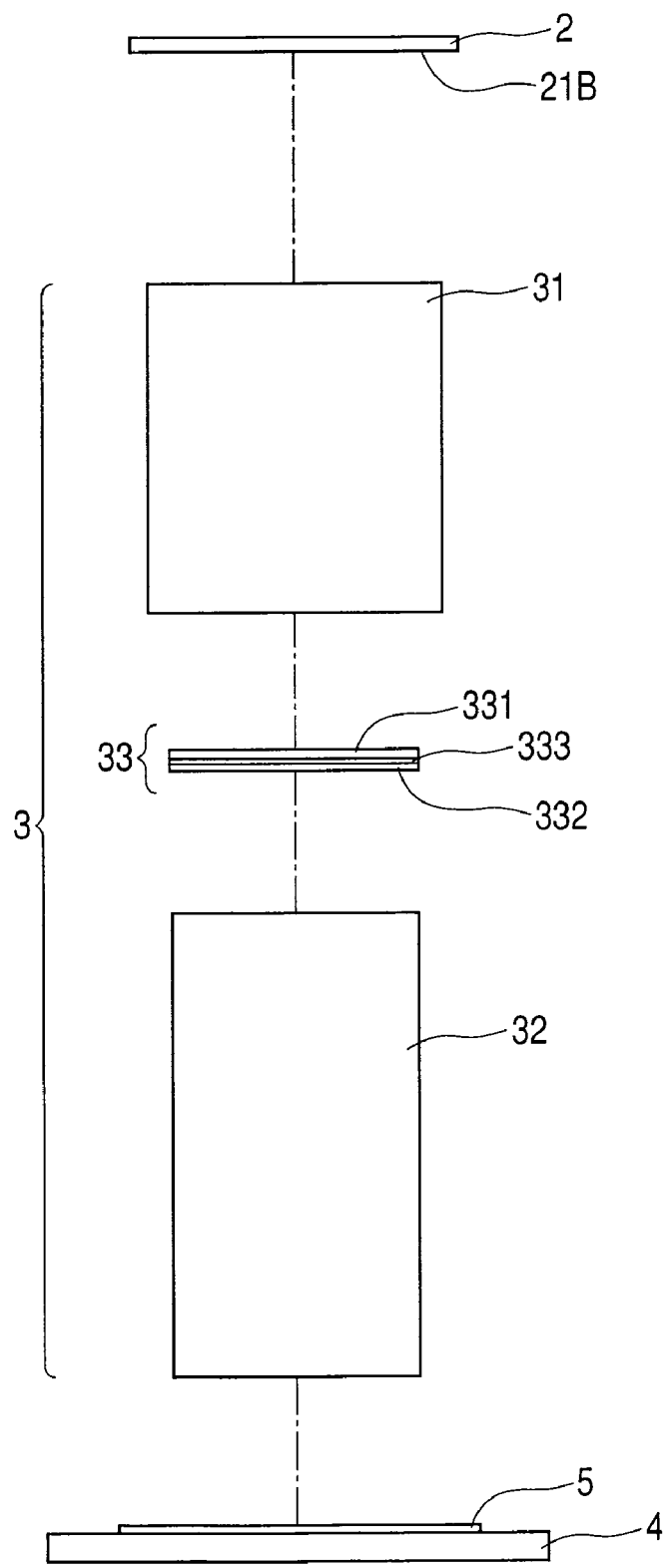
FIG. 5 shows the configuration of a projection system along the center axis in the O direction.
Figure 6A:
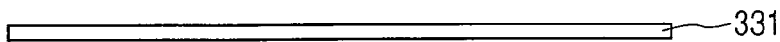
FIGS. 6A and 6B show the configuration of a micro-lens array.
Figure 6B:
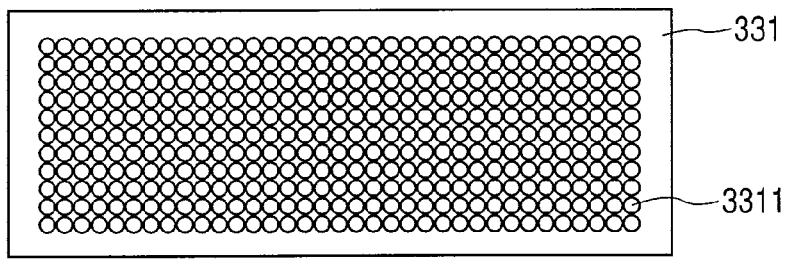
Figure 7A:
FIGS. 7A and 7B show the configuration of a pinhole array.
Figure 7B:
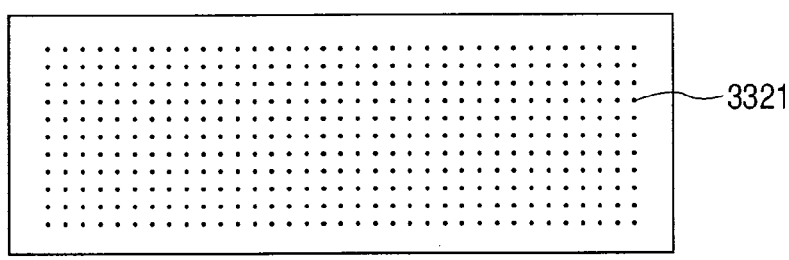
Figure 8:
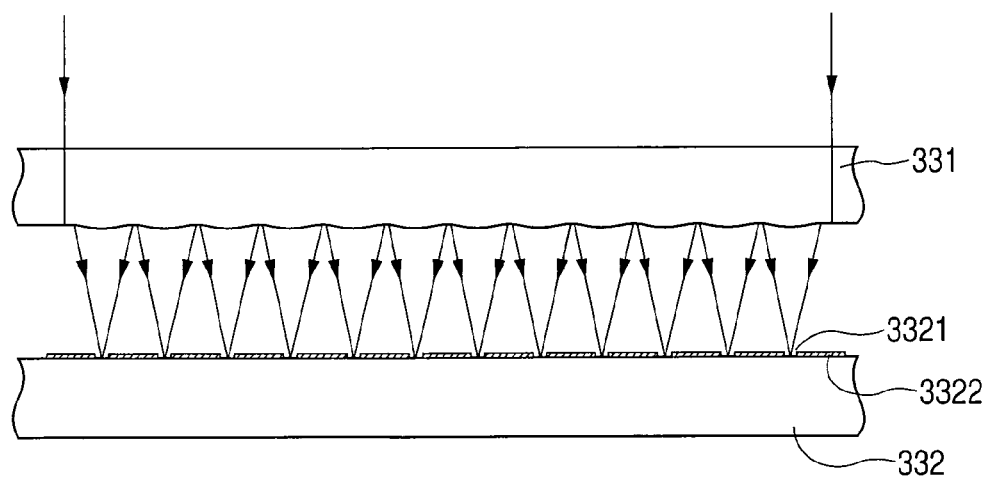
FIG. 8 show the relationship between the micro-lens array and the pinhole array.

FIG. 5 shows the configuration of the projection system 3 along the center axis in the C direction. FIGS. 6A and 6B show the configuration of a micro-lens array and FIGS. 7A and 7B show the configuration of a pinhole array, in each A showing a profile and B showing a plan. FIG. 8 shows the relationship between a micro-lens array 331 and a pinhole array 332.

The projection/image formation lens system 3 in this embodiment includes a first projection/image formation lens 31 arranged in the direction of the optical axis, a micro-lens unit 33 and a second projection/image formation lens 32. The micro-lens unit 33 includes the micro-lens array 331 and the pinhole array 332 in which pinholes 3321 of w in bore are bored, the arrays opposing each other with a spacer 333 in-between.

Light (display picture elements) modulated by the plane of optical modulation 21B of the two-dimensional optical space modulator 2 is caused to form an image on the micro-lenses 3311 of the micro-lens array 331 by the first projection/image formation lens 31 and condensed in the pinholes 3321. The focal distance of the micro-lenses 3311 is 300 μm, and the pinholes 3321 open in the focal positions of these micro-lenses. Light having passed the micro-lenses 3311 and the pinholes 3321 is caused to form a pinhole image on the photosensitive layer of the exposure substrate 5 mounted on the stage 4 by the second projection/image formation lens 32.

Next, the need to substantially equalize the illumination directionalities NAσx and NAσy in the xy-directions will be described, where NA is the numerical aperture of the projection/image formation lens 3 and σx, σy are the sigma values in the x, y-directions, respectively.

Figure 9:
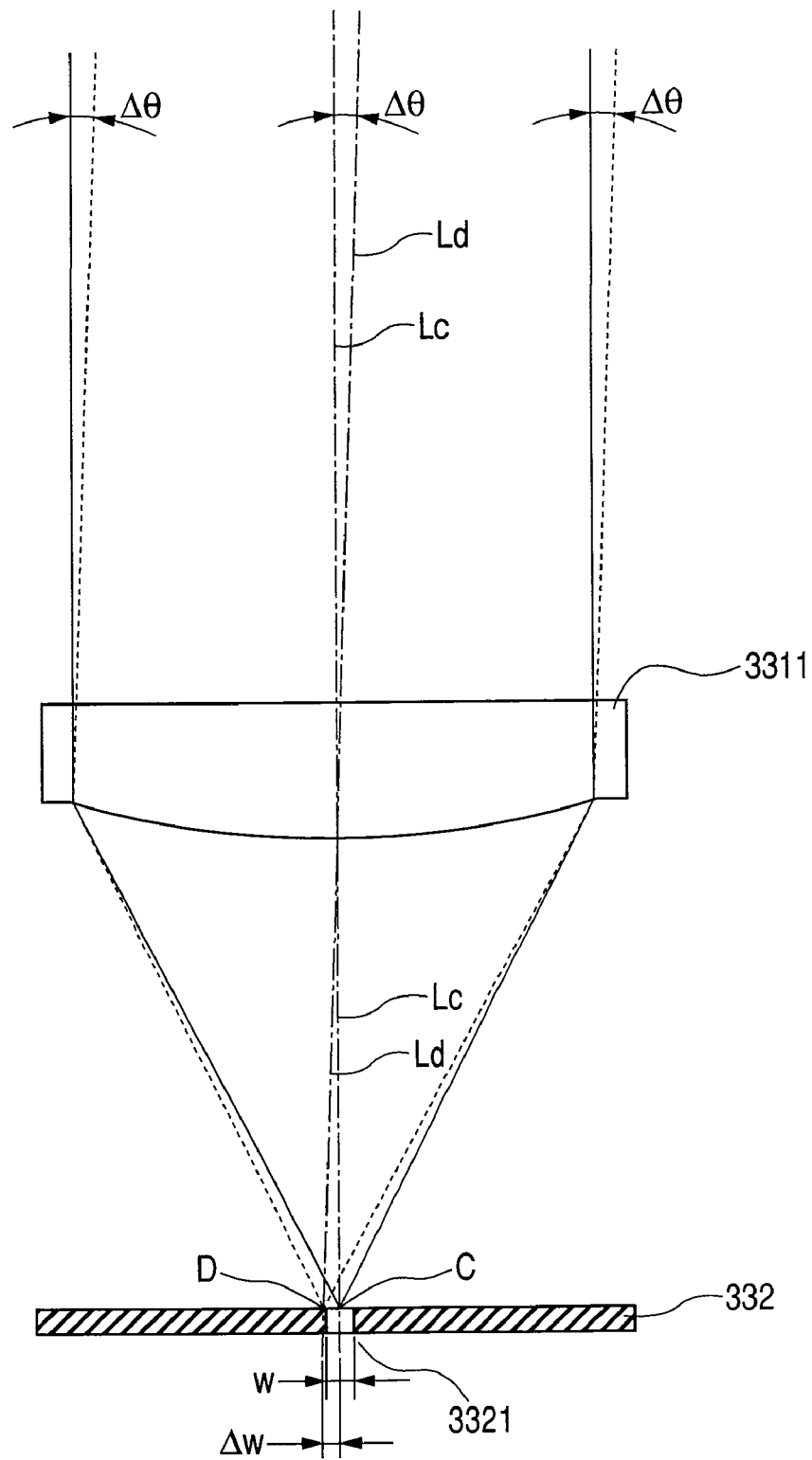
FIG. 9 shows the relationship between light coming incident on a micro-lens and a pinhole.

FIG. 9 shows the relationship between light coming incident on a micro-lens 3311 and a pinhole 3321. In this drawing, Lc represents the center axis of the main light beam and Ld represents that of the incident beam on the outermost circumference.

As described above, the illuminating beams emerging from the integrator 13 illuminate the two-dimensional optical space modulator with the directionalities NAσx and NAσy in the xy-directions. Now, with the magnification of image formation by the first projection/image formation lens 31 being represented by M1, the beam Ld on the outermost circumference among the beams coming incident on the micro-lenses is inclined by Δθ from the main beam Lc coming incident on the micro-lens 3311 shown in FIG. 9, and the values Δθx and Δθy in the xy-directions of Δθ are given by Equations 5 and 6, respectively.

$$\Delta\theta x = NA\sigma x/M1 \quad \text{Equation 5}$$

$$\Delta\theta y = NA\sigma y/M1 \quad \text{Equation 6}$$

This pencil of light beams on the outermost circumference, after passing the micro-lens 3311, is condensed in a position away from the center of the pinhole 3321 by Δw. The x component and the y component of Δw being represented by Δwx and Δwy, respectively, Δwx and Δwy are represented by Equations 7 and 8 relative to the focal distance fML.

$$\Delta wx = fML\Delta\theta x = fML NA\sigma x/M1 \quad \text{Equation 7}$$

$$\Delta wy = fML\Delta\theta y = fML NA\sigma y/M1 \quad \text{Equation 8}$$

If this light condensing position goes out of the aperture of the pinholes, the efficiency of light utilization will be lowered as beams away from the pinholes do not contribute to exposure. Since the pinholes 3321 are circular, it is desirable for NAσx and NAσy to be equal in order for the pencils of light beams inclined by Δθx and Δθy, which are the outermost circumferential component, to enter into the pinholes 3321.

Figure 10:
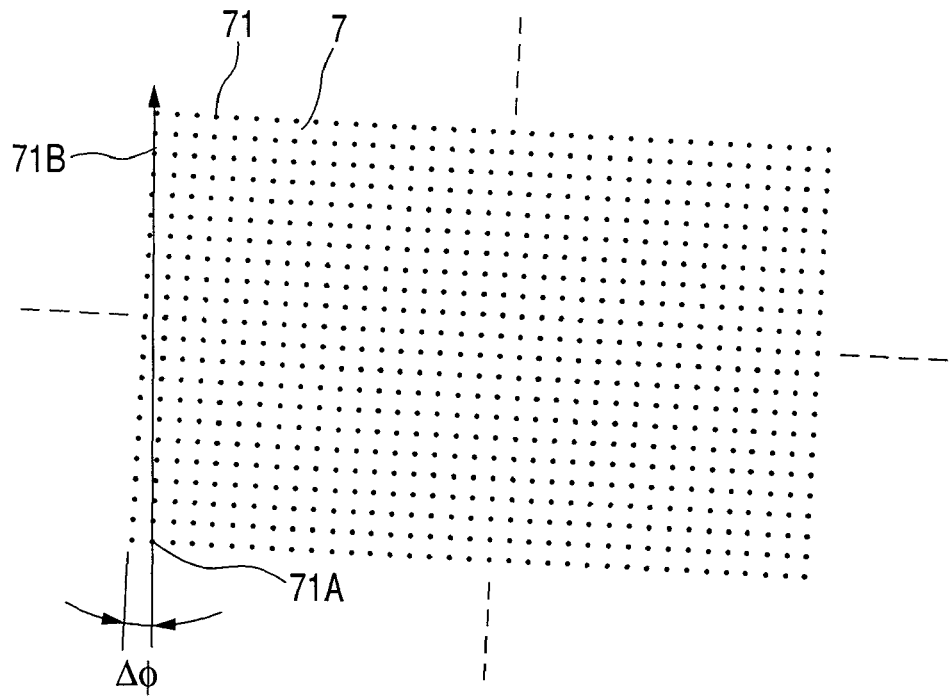
FIG. 10 shows an image of the pinhole array formed on an exposure substrate.
Figure 11:
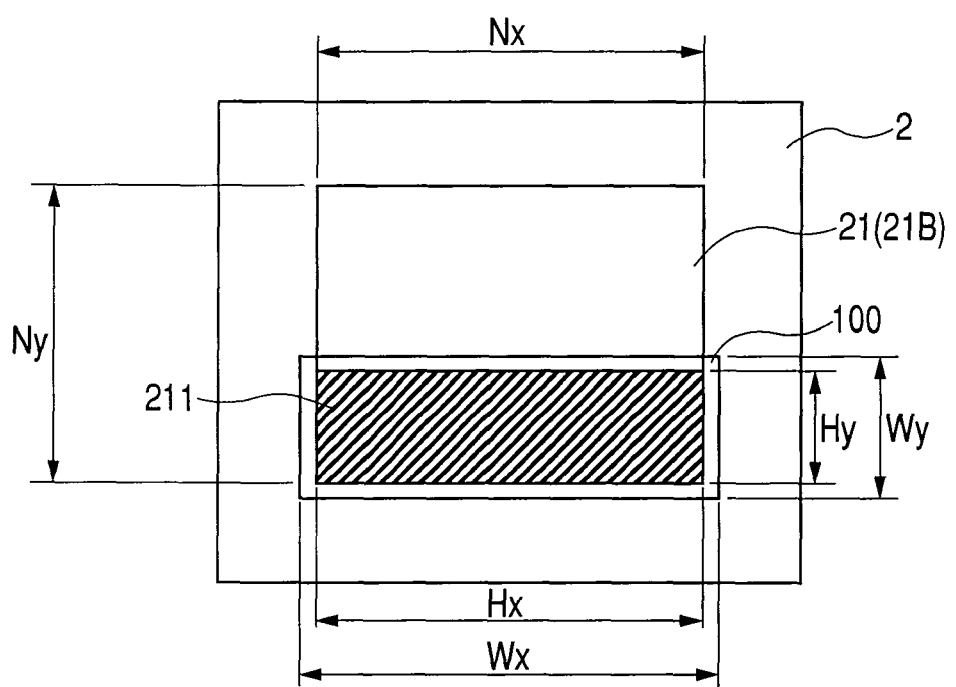
FIG. 11 shows a plan of a two-dimensional optical space modulator.

The light transmitted through the micro-lens array 331 and the pinhole array 332, after being transmitted through the second projection/image formation lens 32, form an image on the exposure substrate 5 of the pinhole array 332 as shown in FIG. 10. The width (size) of the pinhole image 71 relative to the pitch of the pinhole array image 7 is usually ⅒ to ½. Therefore, scanning the stage 4 in the arrayed direction of the pinhole array 7 would leave unexposed parts. To solve this problem, the scanning direction and the arrayed direction of the pinhole array image 7 are inclined by Δφ by scanning the stage 4 in the direction indicated by an arrow in FIG. 10. This results in overlapping of the images of 71A and 71B by the scanning (namely, the same position on the substrate is exposed again). Further in the illustrated case, since rows equivalent to 18 pitch intervene between 71A and 71B, it is possible to achieve exposure at 1/18 of the one-pitch equivalent Pi of the pinhole array image, namely with a resolution of Pi/18. Since a smaller pinhole image than the image of the aperture of the two-dimensional optical space modulator 2 is formed essentially, not only is the definition resolution enhanced, but exposure at this resolution of 1/18 of the pinhole pitch becomes possible.

To add, too fine a resolution would have little practical effect while too rough a resolution would impair smoothness by inclining the pattern or making the edge zigzag. Therefore, it is desirable to select the resolution between 1/60 and 1/7 of the one-pitch equivalent Pi of the pinhole array image (Δδ=0.5° to 8°).

Next, the relationship among the integrator 13, the rod lenses 131 and the irradiated area Hx×Hy will be described.

As stated above, the dimensions of the integrator in the x- and y-directions are Dx and Dy, respectively. Further, the dimensions of the rod lenses 131 in the x- and y-directions are dx and dy, the angles of expansion (angles of divergence) of the light emerging from the rod lenses 131 in the x- and y-directions are θx and θy, respectively. The focal distances of the second optical system are fx and fy, and the dimensions of the two-dimensional optical space modulator in the x- and y-directions Hx and Hy, respectively.

Now, the x- and y-directionalities of the beams (emitted from the second optical system) illuminating the two-dimensional optical space modulator being represented by NAσx and NAσy, NAσx and NAσy are represented by Equations 9 and 10.

$$NA\sigma x = Dx/2fx \quad \text{Equation 9}$$

$$NA\sigma y = Dy/2fy \quad \text{Equation 10}$$

Here, in order to equalize the x- and y-directionalities (NAσx=NAσy), Equation 11 has to be satisfied on the basis of Equations 9 and 10.

$$Dx/Dy = fx/fy \quad \text{Equation 11}$$

Further, where the angles of divergence of the rod lenses 131 are θx and θy, the widths Wx and Wy of the light illuminating the plane of optical modulation 21B of the two-dimensional optical space modulator 2 are given by Equations 12 and 13.

$$Wx = fx \cdot \theta x = fx \cdot n dx/2L \quad \text{Equation 12}$$

$$Wy = fy \cdot \theta y = fy \cdot n dy/2L \quad \text{Equation 13}$$

Hence Wx=Hx and Wy=Hy being supposed, Hx/Hy is determined, (1) determining θx and θy gives fy and fx on the basis of Equations 12 and 13, and (2) determining fy and fx gives Dx and Dy on the basis of Equation 11.

Next, a specific case of Hx/Hy=2.5, for example, will be described.

Now supposing θx:θy=1.6:1, fx/fy=1.6 will be given from Equations 12 and 13. Substituting fx/fy=1.6 into Equation 11 gives Dx/Dy=1.6.

Since Dx/Dy=θx/θy=1.6, an integrator including rod lenses 131 stacked in the same numbers in the x- and y-directions can be used.

That is, a second optical system 15 of fx:fy=1.6:1, even if an integrator 13 of Dx:Dy=1.6:1 is used, can make the ratio of the plane of optical modulation 21B of the two-dimensional optical space modulator 2.5:1. The shape of each individual rod lens can be brought close to dx:dy=1.6:1, close enough to 1.

In other words, by making the focal distances of the second optical system in the xy-directions fx:fy=1.6:1, the aperture ratio Kh of the plane of optical modulation 21B can be made 2.5:1 even if the aperture ratio Kr of the rod lenses 131 is 1.6:1.

Incidentally, in actual apparatuses, the choice is not limited to these values, and each relationship can have a tolerance of about ±25%. Thus, NAσx/NAσy can be made 0.75 to 1.25 for instance. It was confirmed that Hx/Hy can be made 3.5 or above, for instance, in this way.

As hitherto described, since the invention enables light emitted from the light source to efficiently and uniformly illuminate a two-dimensional optical space modulator of a high aperture ratio, the exposure speed can be made faster.

To add, though the above-described embodiment uses semiconductor lasers (LDs) as the light source, other lasers than semiconductor lasers, mercury lamps, light emitting diodes relatively increased in directionality or the like can be used as well in place of LDs.

The second optical system can use either only one cylindrical lens having power in the x-direction or the y-direction or a toroidal lens having different powers in the xy-directions.

Further, the illumination apparatus described with reference to the embodiment can be applied not only to mask-less exposure but extensively where a non-square transversely longer area is to be uniformly and efficiently illuminated. For instance, it is applicable to a pattern inspecting device which is to attempt detection in a broad range, close to a direction at a right angle to the scanning direction, while scanning a stage at high speed.

What is claimed is:

1. A substrate exposure apparatus comprising:

an exposure light source;

a beam forming device that forms light emitted from the exposure light source into highly directional light beams;

a first optical system that guides the directional beams to an integrator;

the integrator consisting of J and K rod lenses arrayed in a x-direction and in a y-direction, respectively, whereas each of the rod lenses measures dx in the x-direction and dy in the y-direction, and the length and refractive index of each rod lens are represented by L and n, respectively, and the angles of divergence in the x-direction and in the y-direction of the beam emerging from the rod lens are represented by θx and θy, respectively;

a second optical system that irradiates the widths Wx and Wy of a two-dimensional optical space modulator with light emerging from the integrator, whereas the focal distances in the x- and y-directions of the second optical system are fx and fy;

the two-dimensional optical space modulator whose dimensions in the x- and y-direction are Hx and Hy, respectively;

a projection optical system, having a micro-lens unit including a micro-lens array and a pinhole array, that projects the light reflected or transmitted by the two-dimensional optical space modulator onto an exposure substrate that is exposed to light; and a stage that is mounted with and scans the exposure substrate in at least one direction, wherein setting Wx=Hx, Wy=Hy, the parameters Wx, Wy, dx, dy, J, K, fx, fy obey the following equations:

$$J \cdot dx/(K \cdot dy) = fx/fY$$

$$Wx = fx \cdot \theta x = fx \cdot n \cdot dx/2L$$

$$Wy = fy \cdot \theta y = fy \cdot n \cdot dy/2L.$$

* * * * *